(12) United States Patent
Chang et al.

(10) Patent No.: US 8,385,082 B2
(45) Date of Patent: Feb. 26, 2013

(54) ELECTRICAL CONNECTION ARRANGEMENT HAVING PCB WITH CONTACTS RECEIVED THEREIN

(75) Inventors: Yen-Chih Chang, Tu-Cheng (TW); Ke-Hao Chen, Tu-Cheng (TW)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 143 days.

(21) Appl. No.: 12/849,820

(22) Filed: Aug. 4, 2010

(65) Prior Publication Data

US 2011/0032681 A1 Feb. 10, 2011

(30) Foreign Application Priority Data

Aug. 4, 2009 (TW) ................ 98-126285 A

(51) Int. Cl.
*H05K 1/11* (2006.01)
*H05K 1/14* (2006.01)
(52) U.S. Cl. .................... 361/803; 361/772; 361/774

(58) Field of Classification Search .......... 361/772–774, 361/803; 439/65–66
See application file for complete search history.

(56) References Cited

U.S. PATENT DOCUMENTS

| | | | |
|---|---|---|---|
| 6,046,909 A | 4/2000 | Joy | |
| 6,286,208 B1 * | 9/2001 | Shih et al. | 29/879 |
| 6,846,184 B2 * | 1/2005 | Fan et al. | 439/66 |
| 6,869,290 B2 * | 3/2005 | Brown et al. | 439/66 |
| 7,052,284 B2 * | 5/2006 | Liao et al. | 439/66 |
| 7,053,496 B2 | 5/2006 | Stone | |
| 7,341,485 B2 * | 3/2008 | Polnyi | 439/591 |
| 7,371,073 B2 | 5/2008 | Williams | |

* cited by examiner

*Primary Examiner* — Tuan T Dinh
(74) *Attorney, Agent, or Firm* — Wei Te Chung; Ming Chieh Chang

(57) ABSTRACT

An electrical connection arrangement includes an IC package, and a PCB having a plurality of receiving holes for receiving a plurality of contacts therein. The contact having a contacting portion engaged with the IC package that seated upon the PCB. A retaining device is provided for securing the IC package onto the PCB. Since there is no socket utilized in the present invention, the total profile of the arrangement and the cost are effectively reduced.

13 Claims, 7 Drawing Sheets

2

ELECTRICAL CONNECTION ARRANGEMENT HAVING PCB WITH CONTACTS RECEIVED THEREIN

BACKGROUND OF THE INVENTION

1. Field of the Invention

The present invention relates to an electrical connection arrangement, and more particularly, to an electrical connection arrangement used for connecting an integrated circuit (IC) package and having a printed circuit board (PCB) with a plurality of contacts received therein.

2. Description of Related Art

A typical socket connector mounted on a PCB for connecting an IC package, typically includes an insulative housing and an array of contacts received in the housing. One end of the contact is connected to the IC package and the other end is engaged with the PCB, such that the electrical connection between the IC package and the PCB is established.

However, the housing of socket connector is designed to have a predetermined height and occupies a certain space above the PCB, which thus fails to meet the trend of frivolity in product design. In another aspect, the housing is made by process of injection molding, and has a relatively high cost.

In view of the above, a cost-effective, and space-effective electrical connection arrangement for connecting an IC package is desired.

SUMMARY OF THE INVENTION

Accordingly, an object of the present invention is to provide an improved electrical connection arrangement having a lower profile and a low cost.

According to one aspect of the present invention, there is provided an electrical connection arrangement, which includes an IC package and a PCB having a plurality of receiving holes for receiving a plurality of contacts therein. The contact having a contacting portion engaged with the IC package that seated upon the PCB. A retaining device is provided for securing the IC package onto the PCB.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
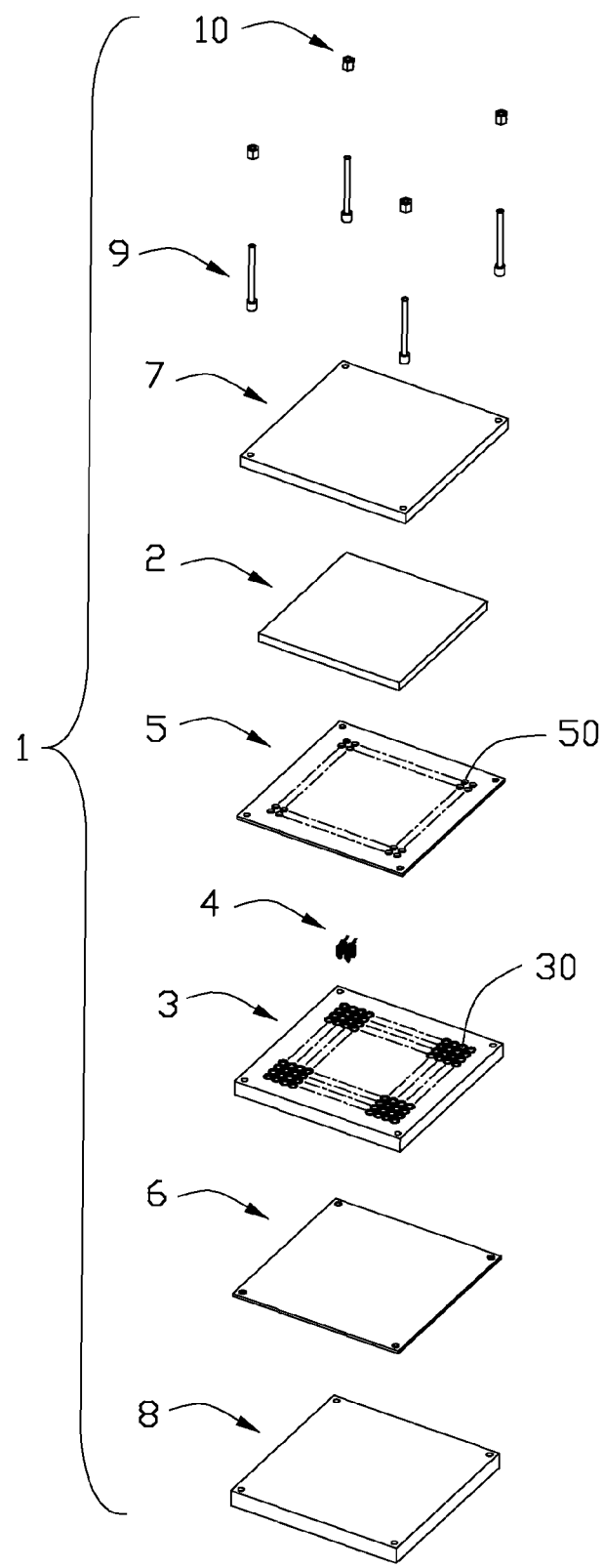
FIG. 1 is an exploded, perspective view of an electrical connection arrangement in accordance with a first preferred embodiment of the present invention.
Figure 2:
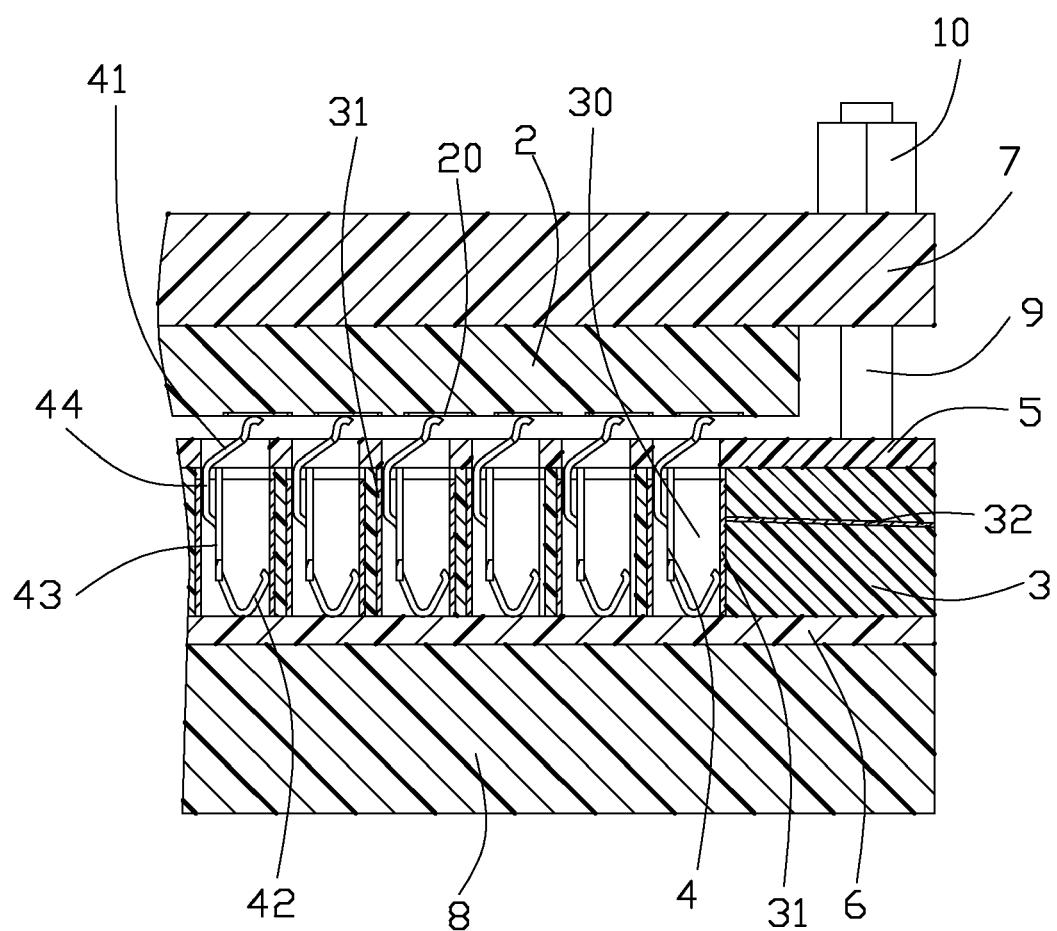
FIG. 2 is a cross-sectional view of the electrical connection arrangement shown in FIG. 1.

Referring to FIG. 1 and FIG. 2, an electrical connection arrangement 1 made in accordance with a first preferred embodiment of the present invention for connecting an IC package 2, includes a PCB 3 and a plurality of contacts 4 mounted within in the PCB 3. The PCB 3 has a plurality of receiving holes 30 extending therethrough for receiving the contacts 4 respectively. Each receiving hole 30 has an inner surface provided with a conductive layer 31 thereon which is connected to a circuit trace 32 integrated within the PCB 3. The contact 4 is engaged with and electrically connected to the conductive layer 31.

Figure 3:
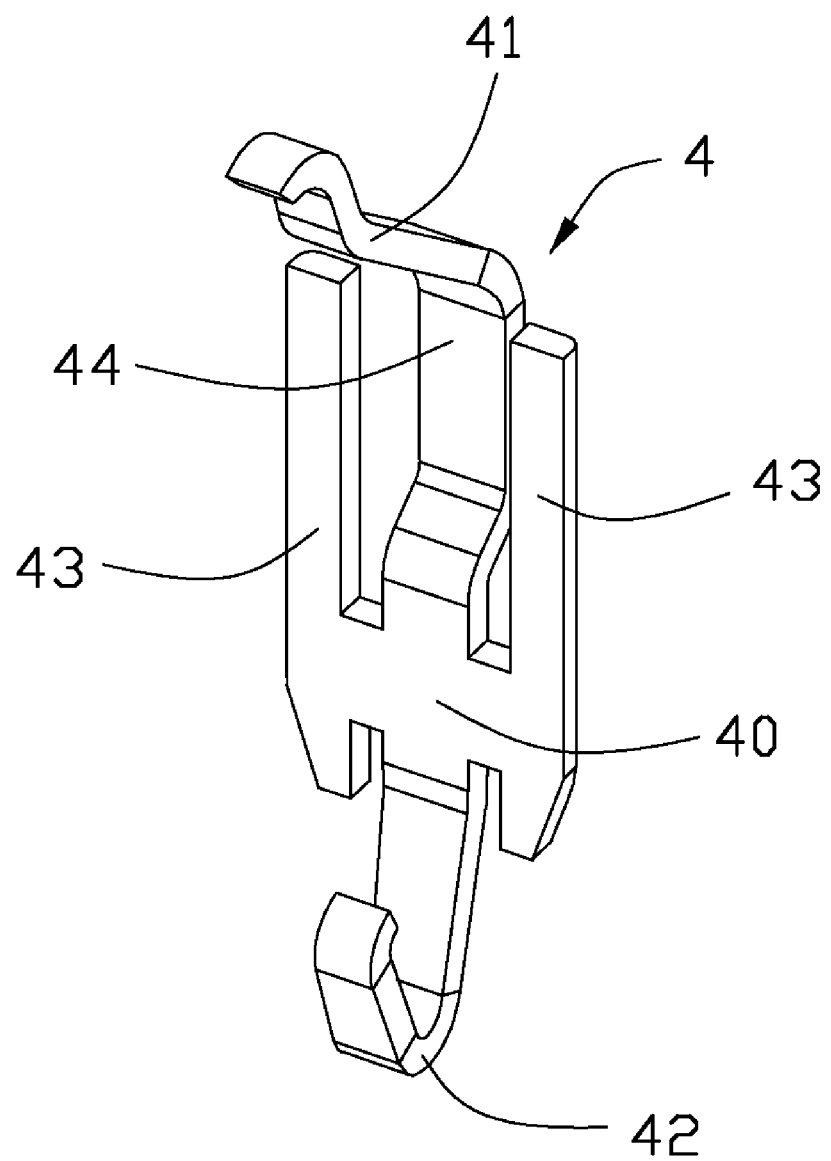
FIG. 3 is a perspective view of a contact of the electrical connection arrangement shown in FIG. 1.

Particularly referring to FIG. 2 and FIG. 3, the contacts 4 include grounding contacts and signal contacts (not respectively labeled) which have substantially same structure. Each contact 4 includes a base portion 40, a contacting portion 41 extending upwardly from the base portion 40, a supporting portion 42 extending downwardly from the base portion 40, and a pair of lateral retaining portions 43 located at opposite sides of the base portion 40. The retaining portions 43 engage with the conductive layer 32 so as to secure the contact 4 into the receiving hole 30. The contact 4 further includes a back portion 44 located between the base portion 40 and the contacting portion 41 and protruding rearward to be offset from the base portion 40, from a side view. The back portion 44 and the retaining portion 43 jointly electrically contact the conductive layer 31 in the receiving hole 30.

An insulative board 5 is provided to be disposed on the PCB 3 and have a plurality of through holes 50 corresponding to the receiving holes 30 of PCB 3. The contacting portion 41 of the contact 4 extends through the through hole 50 of the insulative board 5. The IC package 2 is placed onto the insulative board 5, and has a plurality of leads 20 thereunder electrically contacted with the contacting portions 40 of the contacts 4. The insulative board 5 serves for preventing the PCB 3 from being damaged by the leads 20 of the IC package 2.

A block board 6 is provided under the PCB 3 to close the receiving holes 30 of the PCB 3. The supporting portion 42 of the contact 4 has a substantially V-shape and abuts against the block board 6, so that the contact 4 will not escape away from the receiving hole 30 of the PCB 3. A free end of the supporting portion 42 also contacts the conductive layer 31 in the receiving hole 30. The impedance and inductance resulted by the circuit via contact 4 is therefore reduced, due to the multi-point contact between the contact 4 and the conductive layer 31.

To have the IC package 20 reliably retained onto the PCB 3, a retaining device is needed. In the present invention, the retaining device includes a pressing board 7 for pressing the IC package 2, and a back board 8 under the block board 6. A plurality of screws 9 and nuts 10 are provided to cooperatively fasten the pressing board 7 and the back board 8. Other manners of retaining devices are also feasible. For example, a heat sink (not shown) may be utilized to be placed upon the IC package and directly secure the IC package onto the PCB.

Figure 4:
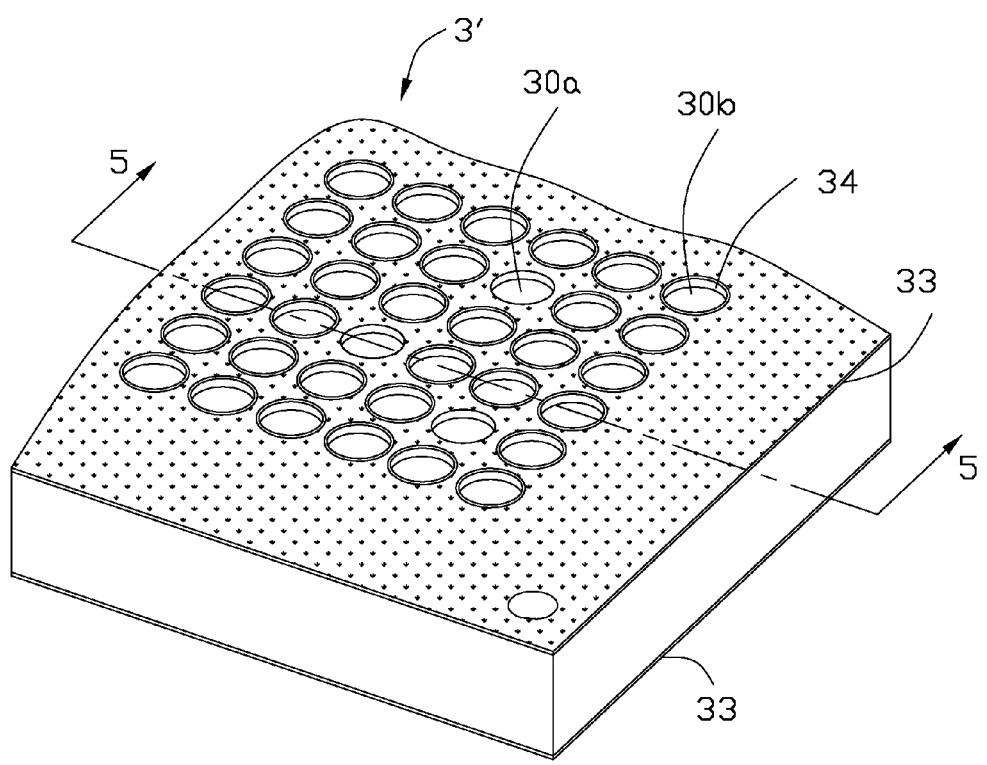
FIG. 4 is a perspective view of a PCB in accordance with a second preferred embodiment of the present invention.
Figure 5:
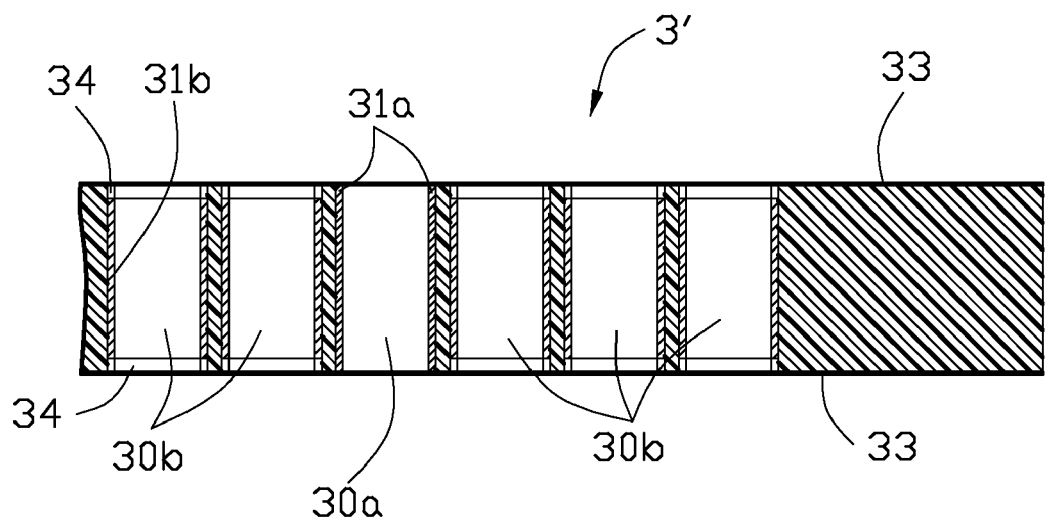
FIG. 5 is a cross-sectional view of the PCB, taken along the line 5-5 in FIG. 4.

FIG. 4 and FIG. 5 illustrate a PCB 3' made in accordance with a second preferred embodiment of the present invention. The PCB 3' has a top surface and a bottom surface respectively plated with a metal sheet 33. A receiving hole 30a in which a grounding contact is received has a conductive layer 31a electrically connected to the metal sheet 33, while a receiving hole 30b in which a signal contact is received has a conductive layer 31b electrically separated from the metal sheet 33 by an insulator 34 formed at a top position of the receiving hole 30b. Due to the metal sheet 33 that connected to all of the conductive layers 31a, a parallel connection of the grounding contacts is reached and therefore the impedance and the inductance are effectively reduced.

Figure 6:
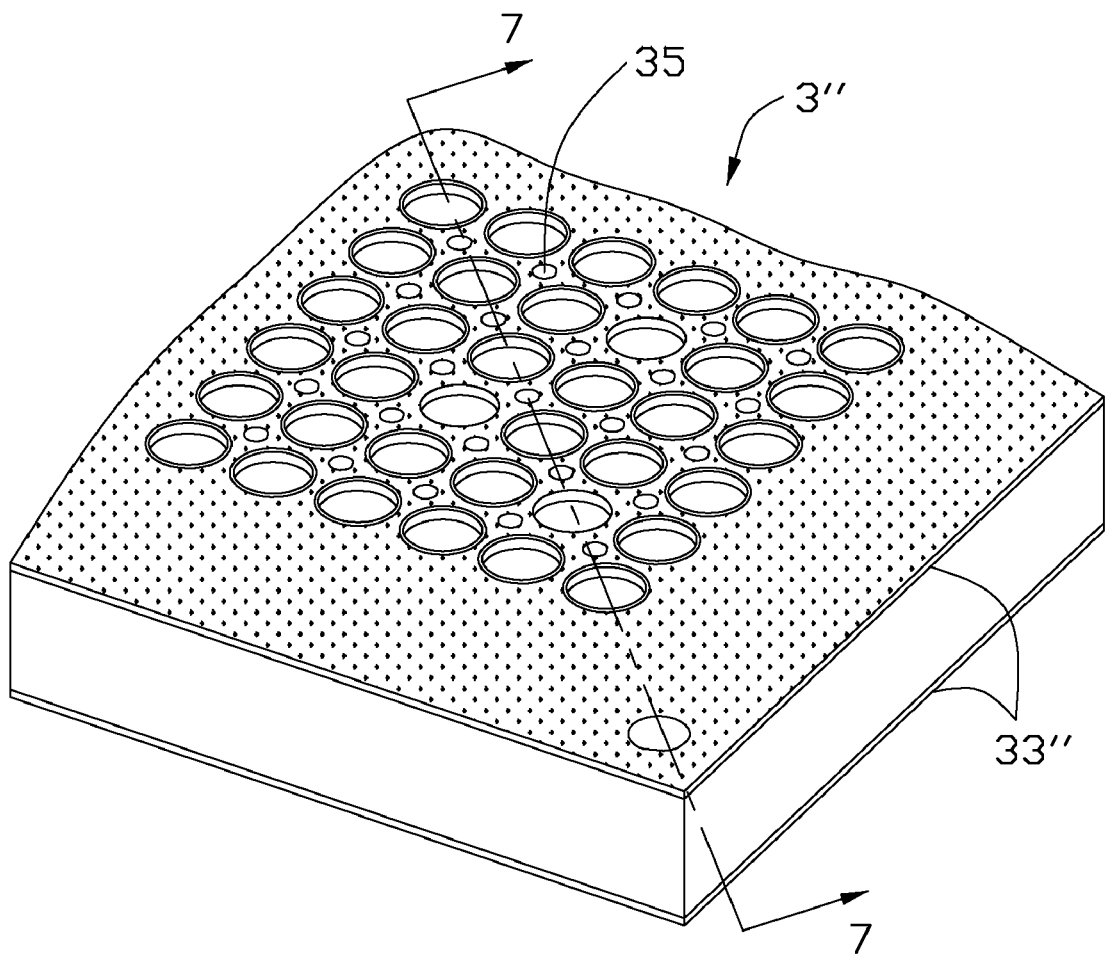
FIG. 6 is a perspective view of a PCB in accordance with a third preferred embodiment of the present invention.
Figure 7:
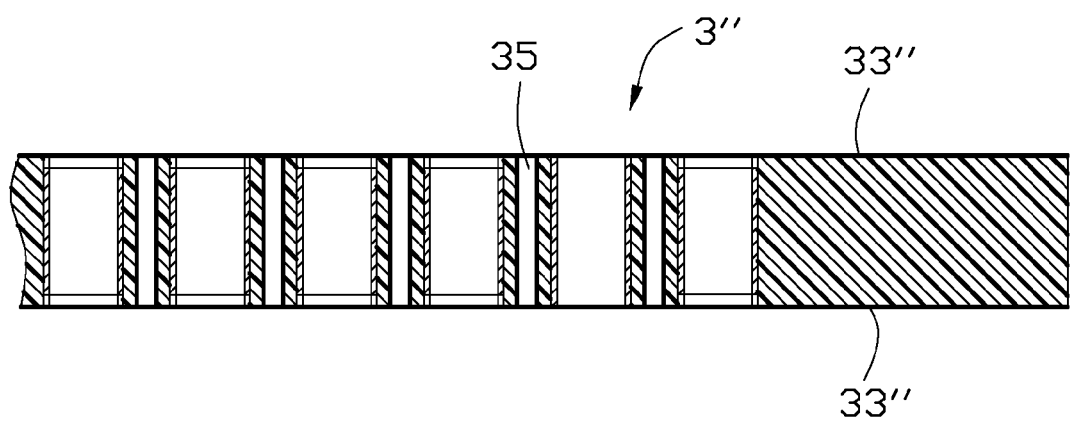
FIG. 7 is a cross-sectional view of the PCB, taken along the line 7-7 in FIG. 6.

FIG. 6 and FIG. 7 illustrate a PCB 3" made in accordance with a third preferred embodiment of the present invention. It is achieved by adding shielding holes 35 into the PCB 3' of the second embodiment. The shielding holes 35 are distributed among the receiving holes and each has a smaller diameter than the receiving hole. A pair of metal sheets 33' that disposed on the top and bottom surfaces of the PCB 3" extend into the shielding holes 35 so as to provide shielding function and prevent cross-talk between the signal contacts.

Since the contacts of the present invention is substantially hidden in the PCB, rather than being hold by an extra socket which tends to occupies a significant space above PCB, the profile of the whole arrangement is effectively reduced and thereby meeting the trend of frivolity in product design. Moreover, the arrangement of the present invention has a relatively low cost.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connection arrangement, comprising:
   an IC package;
   a PCB having a plurality of receiving holes for receiving a plurality of contacts therein, each of the contacts having a contacting portion engaged with the IC package that is seated upon the PCB; and
   a block board engaged with a lower surface of the PCB to support the contacts and prevent the contacts from escaping away from the receiving holes;
   wherein each of the receiving holes has an inner surface provided with a conductive layer, the contact being electrically contacted with the conductive layer;
   wherein the contacts include grounding contacts and signal contacts and the PCB is provided with a metal sheet on an upper surface thereof, the conductive layer in the receiving hole for the grounding contact being electrically connected to the metal sheet, while the conductive layer in the receiving hole for the signal contact being insulative from the metal sheet by an insulator;
   wherein the PCB further comprises a plurality of shielding holes each having a smaller diameter than the receiving hole, the metal sheet extending into the shielding holes so as to provide shielding function and prevent cross-talk between the contacts.

2. The electrical connection arrangement as claimed in claim 1, wherein the conductive layer is electrically connected to a circuit trace integrated within the PCB, so that electrical connection between the IC package and the circuit trace in the PCB is reached.

3. The electrical connection arrangement as claimed in claim 1, further comprising an insulative board disposed on the PCB and having a plurality of through holes corresponding to the receiving holes so as to have the contacting portions of the contacts extend through the through holes, the insulative board being sandwiched between the IC package and the PCB so as to protect the PCB from being damaged by the IC package.

4. The electrical connection arrangement as claimed in claim 2, wherein the contact comprises a base portion, a supporting portion extending downwardly from the base portion, and a pair of lateral retaining portions located at opposite sides of the base portion, the contacting portion extending upwardly from the base portion.

5. The electrical connection arrangement as claimed in claim 4, wherein each of the contacts further comprises a back portion located between the contacting portion and the base portion and protruding rearward to be offset from the base portion, from a side view, both of the retaining portions and the back portion are electrically contacted with the conductive layer in the receiving hole.

6. A PCB assembly for engaging with an IC package, comprising:
   a PCB having a plurality of receiving holes, the receiving hole having an inner surface with a conductive layer disposed thereon;
   a circuit trace integrated within the PCB and electrically connected to conductive layer in the receiving hole; and
   a plurality of contacts received in the receiving holes, each of the contacts being electrically connected to the conductive layer and having a contacting portion extending upwardly for engaging with the IC package, such that the electrical connection between the circuit trace in the PCB and the IC package is reached; wherein
   each of the contacts comprises a base portion, a back portion extending upwardly from the base portion with a contacting portion at a top end thereof for engaging with the IC package and a supporting portion extending downwardly from the base portion, the supporting portion comprises a first portion extending downwardly from the base portion and a second portion extending upwardly form the first portion, the free end of the second portion connects with the conductive layer;
   wherein the contacts include grounding contacts and signal contacts and the PCB is provided with a metal sheet on an upper surface thereof, the conductive layer in the receiving hole for the grounding contact being electrically connected to the metal sheet, while the conductive layer in the receiving hole for the signal contact being insulative from the metal sheet by an insulator;
   wherein the PCB further comprises a plurality of shielding holes each having a smaller diameter than the receiving hole, the metal sheet extending into the shielding holes so as to provide shielding function and prevent cross-talk between the contacts.

7. The PCB assembly as claimed in claim 6, wherein the contact further comprises a pair of retaining portions extending upwardly from the base portion for connecting with the conductive layer, the retaining portions locate at two sides of the back portion.

8. The PCB assembly as claimed in claim 6, wherein the back portion and the supporting portion locate on two sides of the base portion, from a side view.

9. The PCB assembly as claimed in claim 6, further comprising an insulative board disposed on the PCB and having a plurality of through holes corresponding to the receiving hole so as to have the contacting portions of the contacts extend through the through holes, the insulative board being sandwiched between the IC package and the PCB so as to protect the PCB from being damaged by the IC package.

10. The PCB assembly as claimed in claim 9, further comprising a block board disposed under the PCB to support the contacts and prevent the contacts from escaping away from the receiving holes, the material of the block board is different from that of the PCB.

11. An electrical assembly comprising:
   a printed circuit board defining a plurality of conductive through holes extending through both opposite top and bottom surfaces of the printed circuit board, each of said through hole coated with conductive material on a corresponding inner wall and electrically connected with a corresponding conductive trace or layer of the printed circuit board; and a plurality of contacts respectively inserted into and fixedly disposed within the corresponding through holes with corresponding contacting sections extending upwardly out of the corresponding through holes and above the top surface, each of said contacts being an unitary piece, which is stamped from sheet metal, and being discrete from the conductive material in the corresponding through hole while defining an intimately contacting relation therebetween; wherein the contact connects to the corresponding conductive trace or layer via the conductive material in the corresponding through hole; wherein the contacts include grounding contacts and signal contacts and the printed circuit board is provided with a metal sheet on an upper surface thereof, the conductive layer in the through hole for the grounding contact being electrically connected to the metal sheet, while the conductive layer in the through hole for the signal contact being insulative from the metal sheet by an insulator;

wherein the printed circuit board further comprises a plurality of shielding holes each having a smaller diameter than the through hole, the metal sheet extending into the shielding holes so as to provide shielding function and prevent cross-talk between the contacts.

12. The electrical assembly as claimed in claim 11, further including an insulative board seated upon the top surface to with a plurality of through apertures dimensioned and configured in aligned with the corresponding through holes, respectively, for allowing upward extension of the contacting sections of the corresponding contacts while also preventing upward movement of the corresponding contacts;

wherein said insulative board is upwardly exposed to an exterior for confrontation with an IC (Integrated Circuit) package.

13. The electrical assembly as claimed in claim 11, further including an insulative block board intimately located under the bottom surface of the printed circuit board against which a bottom portion of each of said contacts abuts for preventing downward movement of the corresponding contacts.

* * * * *